(12) United States Patent
Kuo (10) Patent No.: US 12,550,246 B2
(45) Date of Patent: Feb. 10, 2026

(54) CIRCUIT BOARD STRUCTURE AND MANUFACTURING METHOD THEREOF

(71) Applicant: UNIMICRON TECHNOLOGY CORP., Taoyuan (TW)

(72) Inventor: Chun Hung Kuo, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 524 days.

(21) Appl. No.: 18/095,318

(22) Filed: Jan. 10, 2023

(65) Prior Publication Data
US 2024/0179829 A1  May 30, 2024

(30) Foreign Application Priority Data

Nov. 25, 2022  (TW) ................... 111145139

(51) Int. Cl.
*H05K 1/02* (2006.01)
*H05K 3/46* (2006.01)

(52) U.S. Cl.
CPC .......... *H05K 1/0204* (2013.01); *H05K 1/024* (2013.01); *H05K 3/4673* (2013.01); *H05K 3/4679* (2013.01); *H05K 2201/0191* (2013.01); *H05K 2201/0379* (2013.01); *H05K 2203/0415* (2013.01)

(58) Field of Classification Search
CPC ................ H05K 1/0204; H05K 1/024; H05K 2201/0191
USPC .......................................... 174/250
See application file for complete search history.

(56) References Cited

U.S. PATENT DOCUMENTS

| | | | |
|---|---|---|---|
| 7,964,106 B2 | 6/2011 | Chen | |
| 10,504,926 B2 | 12/2019 | Zhou et al. | |
| 2014/0367843 A1 | 12/2014 | Nalla et al. | |

FOREIGN PATENT DOCUMENTS

| | | |
|---|---|---|
| CN | 105000552 A | 10/2015 |
| CN | 108456478 A | 8/2018 |
| TW | I603654 B | 10/2017 |

*Primary Examiner* — Timothy J Thompson
(74) *Attorney, Agent, or Firm* — Maschoff Brennan (57) ABSTRACT

A circuit board structure includes a build-up structure, a graphene layer disposed on the build-up structure, and at least one conductive pillar disposed on the graphene layer, the graphene layer includes an oxidized area not covered by the at least one conductive pillar and a non-oxidized area covered by the at least one conductive pillar, and the at least one conductive pillar is electrically connected to the build-up structure via the non-oxidized area.

14 Claims, 10 Drawing Sheets

FIG. 14

CIRCUIT BOARD STRUCTURE AND MANUFACTURING METHOD THEREOF

CROSS-REFERENCE TO RELATED APPLICATIONS

This non-provisional application claims priority under 35 U.S.C. § 119(a) on Patent Application No(s). 111145139 filed in Taiwan (R.O.C.) on Nov. 25, 2022, the entire contents of which are hereby incorporated by reference.

TECHNICAL FIELD

The disclosure relates to a circuit board structure and a manufacturing method thereof.

BACKGROUND

Embedded Trace Substrate (ETS) is a circuit board whose circuit pattern is in an insulating material. ETS has a coreless structure, which allows for the implementation of microcircuits in a cost-effective manner and therefore is widely used in related fields.

In terms of transmission and integrity of signal, the conventional ETS still needs to be improved. Specifically, regarding the manufacturing of a conventional ETS, the build-up process is performed on a core layer so that a metallic film (e.g., copper foil) of the core layer will cover the outermost circuit pattern of the build-up substrate; thus, in order to expose the outermost circuit pattern that is covered by the metallic film, a treatment for removing metallic film is needed to perform. However, the solution used in the treatment is corrosive to both the circuit pattern and the metallic film since the circuit pattern and the metallic film are generally made of cooper. As a result, the solution is easily to etch the circuit pattern and thereby damaging the shape of the circuit pattern. This will result in effects on the aspects, such as signal transmission and signal integrity.

Some had tried to add an etching stop layer which is not made of cooper to protect the circuit pattern, but they still fail to prevent the etching during the removal of the copper foil, and the etching stop layer does not have any other contribution and needed to be removed eventually.

SUMMARY

Accordingly, one aspect of the disclosure is to provide a circuit board structure and a manufacturing method thereof which are capable of effectively preventing from etching copper foil.

One embodiment of the disclosure provides a circuit board structure including a build-up structure, a graphene layer disposed on the build-up structure, and at least one conductive pillar disposed on the graphene layer, the graphene layer includes an oxidized area not covered by the at least one conductive pillar and a non-oxidized area covered by the at least one conductive pillar, and the at least one conductive pillar is electrically connected to the build-up structure via the non-oxidized area.

In one embodiment of the disclosure, the circuit board structure further includes a heat source disposed on the at least one conductive pillar.

In one embodiment of the disclosure, the circuit board structure further includes a cooler disposed on the graphene layer and in thermal contact with the heat source via the graphene layer.

In one embodiment of the disclosure, the at least one conductive pillar includes a plurality of conductive pillars, and one of the plurality of conductive pillars is located between the cooler and the non-oxidized area.

In one embodiment of the disclosure, the build-up structure includes a plurality of wiring layers and a plurality of dielectric layers which are alternately stacked and a plurality of conductive vias which are electrically connected between the plurality of wiring layers, and the at least one conductive pillar is electrically connected to one of the plurality of wiring layers which is located closest to the graphene layer via the non-oxidized area.

Another embodiment of the disclosure provides a manufacturing method of a circuit board structure, the manufacturing method includes: providing a carrier; forming a graphene layer on the carrier; forming a build-up structure on the graphene layer; removing the carrier from the graphene layer; disposing at least one conductive pillar on the graphene layer; and performing an oxidation treatment on the graphene layer so as to form an oxidized area not covered by the at least one conductive pillar and a non-oxidized area covered by the at least one conductive pillar on the graphene layer.

In one embodiment of the disclosure, the area of the graphene layer which is not covered by the patterned mask corresponds to one of a plurality of wiring layers of the build-up structure which is located closest to the graphene layer.

In one embodiment of the disclosure, the at least one conductive pillar is electrically connected to one of a plurality of wiring layers of the build-up structure which is located closest to the graphene layer via the non-oxidized area.

In one embodiment of the disclosure, forming the build-up structure on the graphene layer includes: alternately stacking a plurality of wiring layers and a plurality of dielectric layers on the graphene layer and forming a plurality of conductive vias which are electrically connected between the plurality of wiring layers.

In one embodiment of the disclosure, forming the graphene layer on the carrier includes: forming the graphene layer on a metallic film of the carrier.

In one embodiment of the disclosure, removing the carrier from the graphene layer includes: removing a substrate of the carrier from the metallic film; and removing the metallic film from the graphene layer.

In one embodiment of the disclosure, the manufacturing method further includes: disposing a heat source on the at least one conductive pillar; and providing a bonding structure to cover the at least one conductive pillar and to be connected between the heat source and the oxidized area.

In one embodiment of the disclosure, the manufacturing method further includes: disposing a cooler on the graphene layer so that the heat source is in thermal contact with the cooler via the graphene layer.

According to the circuit board structures and the manufacturing methods of the embodiments of the disclosure as discussed above, the graphene layer is provided on the carrier to be employed as a seed layer for the formation of the build-up structure, thus, during the removal of the metallic film of the carrier, due to its high resistance to the solvent used in removing the metallic film, the graphene layer is able to be served as an etching stop layer to effectively prevent the corrosives or solution that involved in removal of the metallic film from affecting or damaging the wiring layer of the build-up structure and thereby ensuring that the wiring layers remain the shape that meets the required signal transmission and signal integrity for the circuit board structure.

Also, considering the property difference between the graphene and the graphene oxide, the non-oxidized area of the graphene layer which is covered by the conductive pillar remains electrically conductive and therefore enables the required electrical connection between the conductive pillar and the internal wirings of the build-up structure, meanwhile, the portion of the graphene layer not covered by the conductive pillar is oxidized to be an oxidized area and therefore becomes dielectric, such that the oxidized area is able to protect the part of the build-up structure that does not correspond to the conductive pillar. Further, due to the high thermal conductivity of the graphene layer, the graphene layer can be employed as a thermally-conductive layer between a cooler and a heat source to efficiently transfer heat from the heat source to the cooler. Compared to the prior art that directly providing corrosives or solution to remove the metallic film will etch the wirings inside the build-up structure or compared to the prior art that adopts an etching stop layer needed to be removed eventually, the disclosure adopts a graphene layer as an etching stop layer not only can effectively prevent corrosives or solution that involved in removal of metallic film from etching wirings of build-up structure but also can served as a path for heat dissipation.

BRIEF DESCRIPTION OF THE DRAWINGS

The Present Disclosure Will Become Better Understood from the Detailed Description Given Hereinbelow and the Accompanying Drawings which are Given by Way of Illustration Only and Thus are not Intending to Limit the Present Disclosure and Wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

FIGS. 1-10 show the steps of a manufacturing method of a circuit board structure according to one embodiment of the disclosure, where FIGS. 1-10 are depicted in cross-sectional view for better understanding the manufacturing method.

Figure 1:
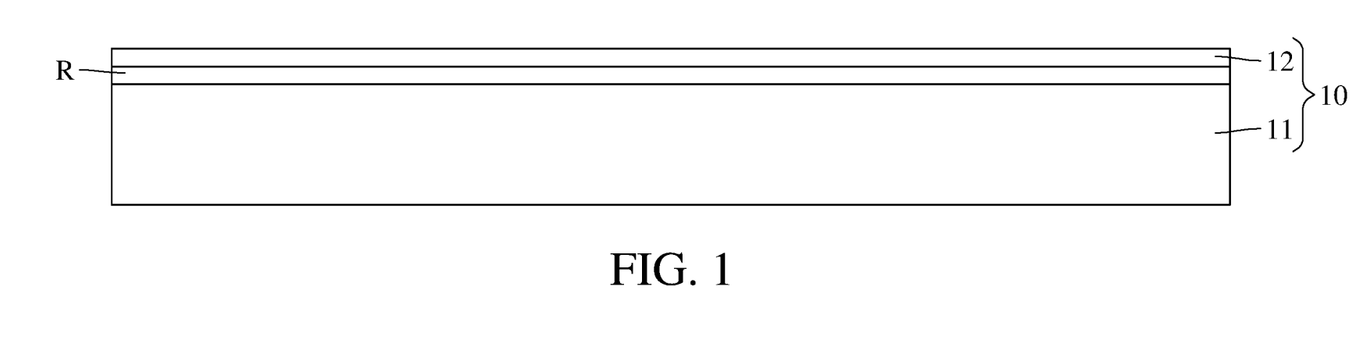
FIGS. 1-10 show the steps of a manufacturing method of a circuit board structure according to one embodiment of the disclosure.

Firstly, see FIG. 1, a carrier 10 is provided. The configuration, type and material of the carrier 10 are determined according to actual requirements and are not intended to limit the disclosure. For example, in this embodiment, the carrier 10 may include a substrate 11. The substrate 11 is, for example, a glass substrate, a silicon substrate, a ceramic substrate, or a combination thereof. Optionally, the carrier 10 may further include at least one metallic film 12 which is disposed on at least one side (or, surface) of the substrate 11. The metallic film 12 is, for example, a metallic layer having a suitable thickness. For example, in some embodiments, the metallic film 12 may be a copper foil having a suitable thickness. It is noted that the formation, material, and thickness of the metallic film 12 may be determined according to actual requirements and are not intended to limit the disclosure. In some other embodiments, there may be another metallic film 12 disposed on the other side of the substrate 11 of the carrier 10.

Optionally, in this embodiment, there may be a release film R disposed between the substrate 11 of the carrier 10 and the metallic film 12. The release film R may be, but is not limited to be, a photo-curable release film, a thermal curable release film, or a laser debond release film with a required thickness. Note that the material, thickness, and formation of the release film R may be determined as required.

Figure 2:
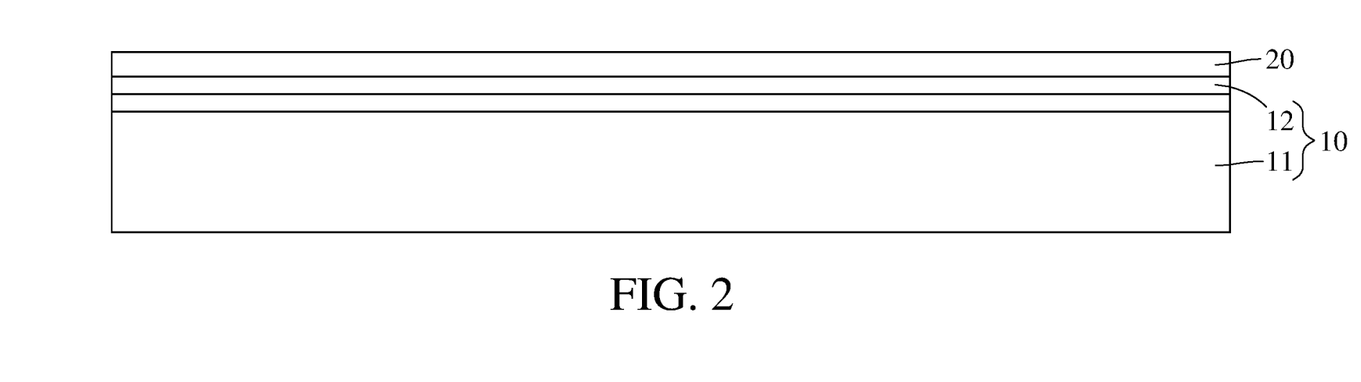

Then, please refer to FIG. 2, a graphene layer 20 is formed on the carrier 10. Specifically, the graphene layer 20 is disposed on the metallic film 12 of the carrier 10. The graphene layer 20 herein means a layer including graphene not yet oxidized, thus graphene layer 20 merits special interest not only due to its high thermal conductivity but high thermal stability and exceptional chemical resistance.

It is noted that the graphene is not only thermally conductive but also behaves as a brilliant electrical conductor. In addition, the graphene may have a resistivity way lower than copper and silver, such as approximately $10^{-6}$ $\Omega \cdot cm$; the graphene may have a thermal conductivity higher than carbon nanotubes and diamond, such as 5300 W/m·k; the graphene at room temperature may exhibit an electron mobility higher than carbon nanotubes and silicon, such as 15000 $cm^2/V \cdot s$; and the graphene also has high acid and alkali resistance and high resistance to the solvent used in removing the metallic film 12. The above advantages make the graphene widely developed to be the material in anti-corrosion and heat dissipation coating. As such, with the existence of the graphene, the graphene layer 20 is suitable to be employed as a protection for preventing corrosive substance from damaging the selected metal. Note that the formation, arrangement, and thickness of the graphene layer 20 may be modified as required and not intended to limit the disclosure.

The graphene can be oxidized and turned into graphene oxide (GO); specifically, graphene oxide can be artificially created by treating graphene with oxidizers. The graphene oxide remains thermally conductive similar to or the same as the graphene but becomes dielectric. Thus, the graphene oxide can be applied to dielectric and heat dissipation coating. Considering the property difference between the graphene and the graphene oxide, it is possible to turn any selected portion of the graphene layer 20 to be dielectric by partially oxidizing the graphene layer 20.

Figure 3:
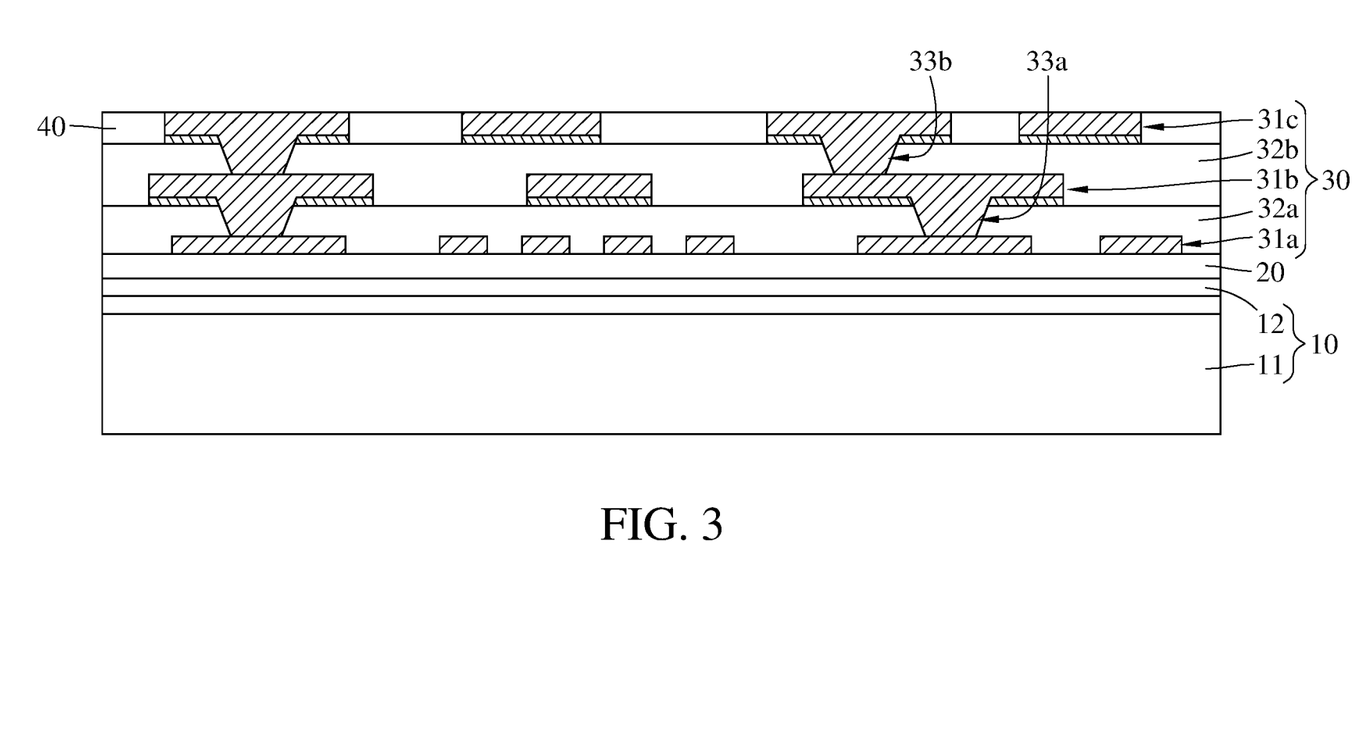

Then, please refer to FIG. 3, at least one build-up structure 30 is formed on the graphene layer 20. Specifically, the build-up structure 30 is formed on a side (or, surface) of the graphene layer 20 which is located furthest away from the metallic film 12 using any suitable processes. In detail, a plurality of wiring layers (e.g., wiring layers 31a, 31b, and 31c as shown in the drawings) and a plurality of dielectric layer (e.g., dielectric layers 32a and 32b as shown in the drawings) are alternately stacked on a side (or, surface) of the graphene layer 20 which is located furthest away from the metallic film 12, and there are conductive vias 33a and 33b which are electrically connected between the wiring layers 31a, 31b, and 31c. The wiring layers 31a, 31b, and 31c, the dielectric layers 32a and 32b, and the conductive vias 33a and 33b form the build-up structure 30. Accordingly, the graphene layer 20 provides a surface for the formation of the first wiring layer (e.g., the wiring layer 31a) of the build-up structure 30 and therefore can be employed as a seed layer for the formation of the build-up structure 30.

Note that the build-up structure 30 is exemplary and the numbers, formations, materials, thicknesses of the wiring layer, the dielectric layer, and the conductive via of the build-up structure 30 may be modified as required and not intended to limit the disclosure.

Optionally, a protection layer 40 may be disposed on a side (or, surface) of the build-up structure 30 which is located furthest away from the graphene layer 20 or the carrier 10. The protection layer 40 may be made of photosensitive dielectric material, ABF film, or macromolecule resin, but the disclosure is not limited thereto. The protection layer 40 may cover the wiring layer and the dielectric layer (e.g., wiring layer 31c and dielectric layer 32b) of the build-up structure 30 which are located furthest away from the graphene layer 20 or the carrier 10.

Figure 4:
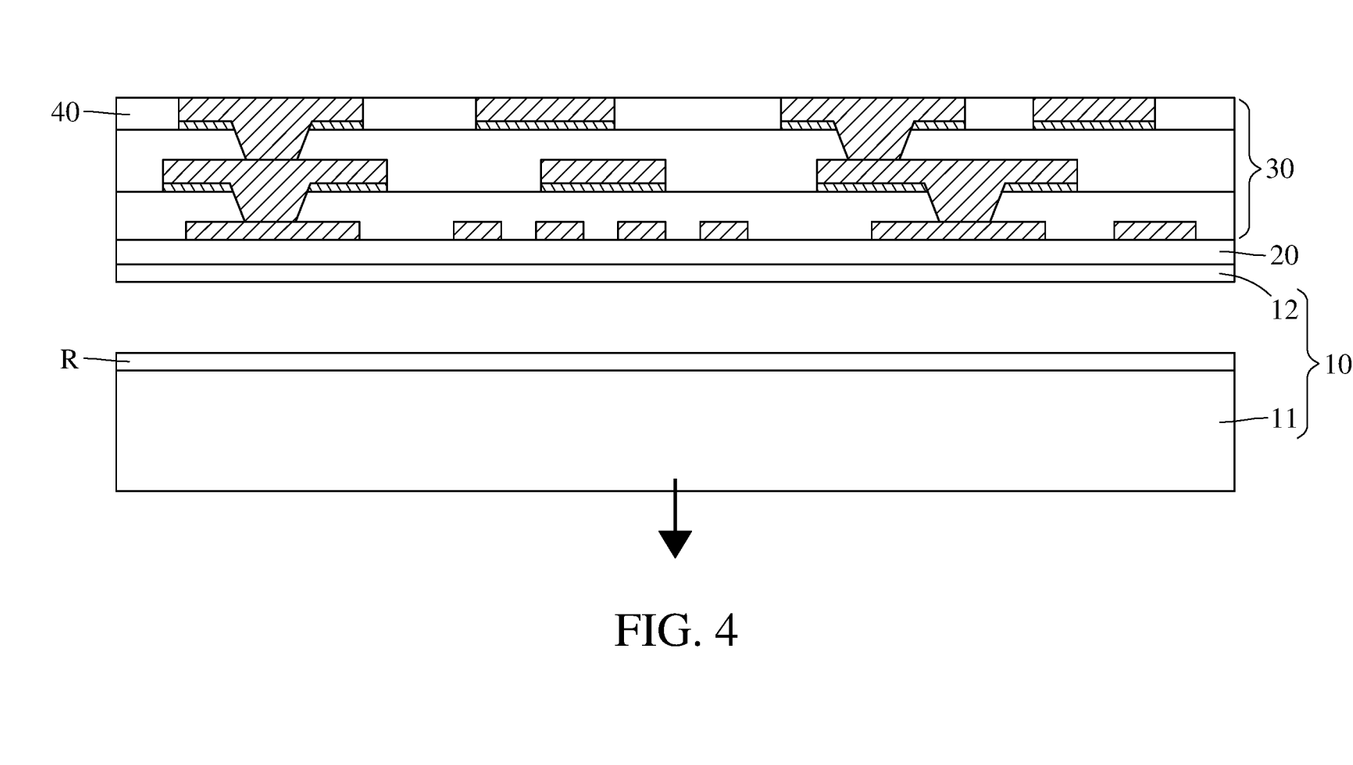
Figure 5:
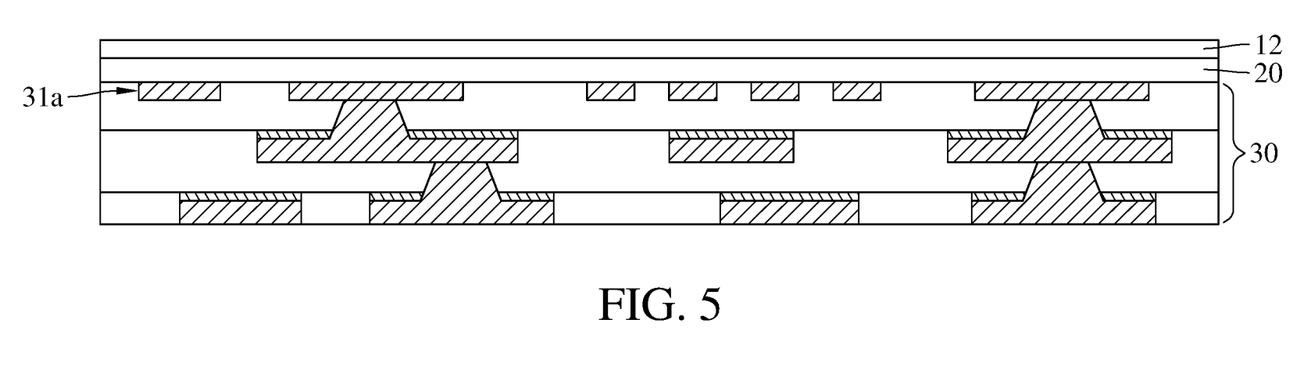
Figure 6:
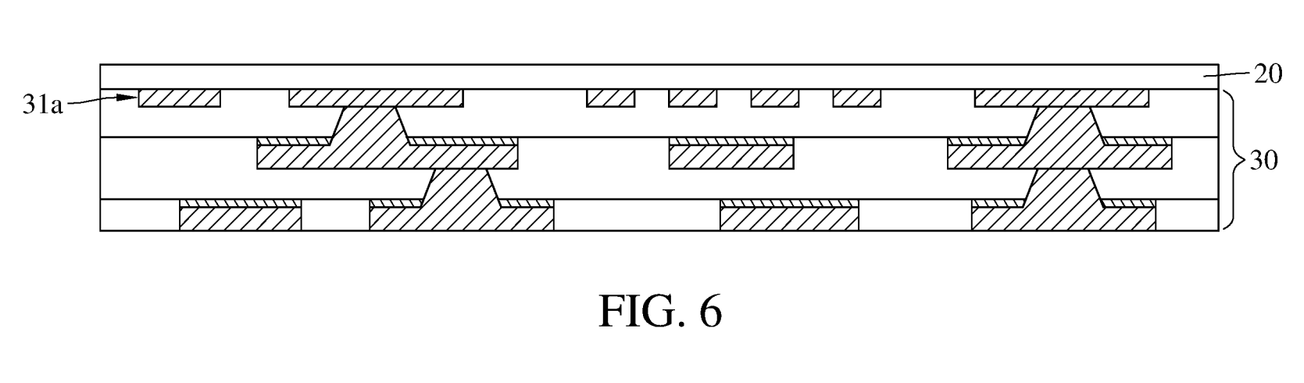

Then, please refer to FIGS. 4-6, the carrier 10 is removed from the graphene layer 20. Firstly, as shown in FIG. 4, a substrate removal process is performed on the carrier 10 to remove the substrate 11 of the carrier 10 from the metallic film 12; specifically, by separating the metallic film 12 of the carrier 10 from the release film R, the metallic film 12 can be removed from the substrate 11 and thereby obtaining a laminated structure of the build-up structure 30, the graphene layer 20, and the metallic film 12. In this embodiment, the removal of the release film R from the metallic film 12 may be achieved using any suitable method, such as providing specific light, heating, applying mechanical force (e.g., peeling) or reducing the adhesiveness of the release film R by laser, but the disclosure is not limited thereto. In some other embodiments that the metallic film 12 may be directly removed from the substrate 11, there may be no release film R between the substrate 11 and the metallic film 12.

Then, optionally, as shown in FIG. 5, the laminated structure of the build-up structure 30, the graphene layer 20, and the metallic film 12 is turned upside down to make the metallic film 12 face specific direction (e.g., face upwards) for the later processes.

Then, as shown in FIG. 6, the metallic film 12 is removed from the graphene layer 20. For example, the metallic film 12 can be removed from the graphene layer 20 using any suitable corrosives or solution. The corrosives or solution may include any substance capable of etching cooper, such as $H_2SO_4/H_2O_2$, $CuCl_2$, $Fe_2(SO_4)_3$, but the disclosure is not limited thereto. The graphene layer 20 is able to resist the corrosives or solution that is corrosive enough to remove the metallic film 12 and therefore is able to prevent the corrosives or solution from damaging the wiring layer of the build-up structure 30 (e.g., the wiring layer 31a); in other words, the graphene layer 20 is served as a protection for the build-up structure 30 during the removal of the metallic film 12.

Compared to the prior art that directly providing corrosives or solution to remove the metallic film will etch the wirings inside the build-up structure, the graphene layer 20 is able to be served as an etching stop layer at a side (or, surface) of the build-up structure 30 located close to the metallic film 12 so that the graphene layer 20 is able to effectively prevent the removal of the metallic film 12 from affecting or damaging the wiring layer (e.g., wiring layer 31a) of the build-up structure 30 and thereby ensuring that the wiring layers remain the shape that meets the required signal transmission and signal integrity for the circuit board structure.

Figure 7:
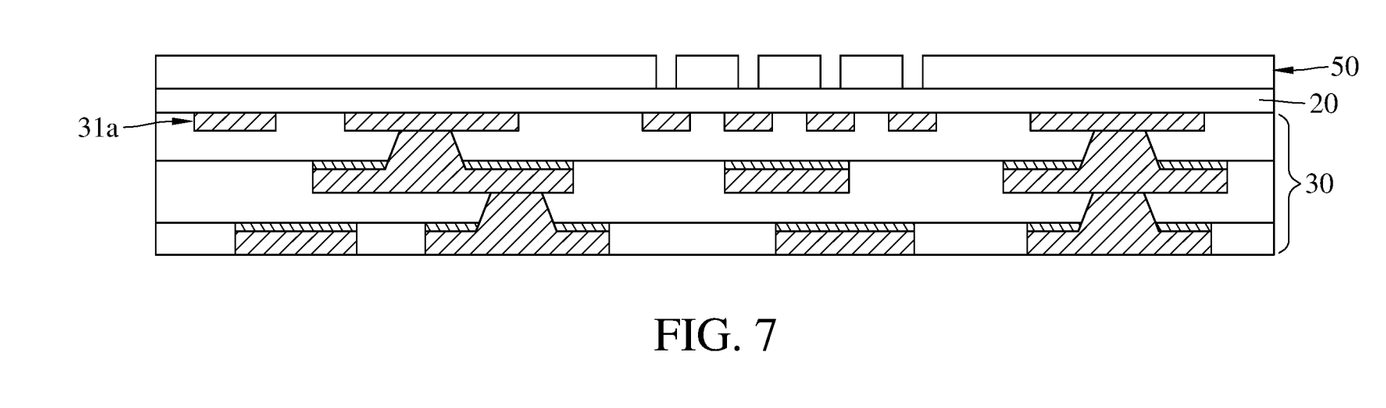
Figure 8:
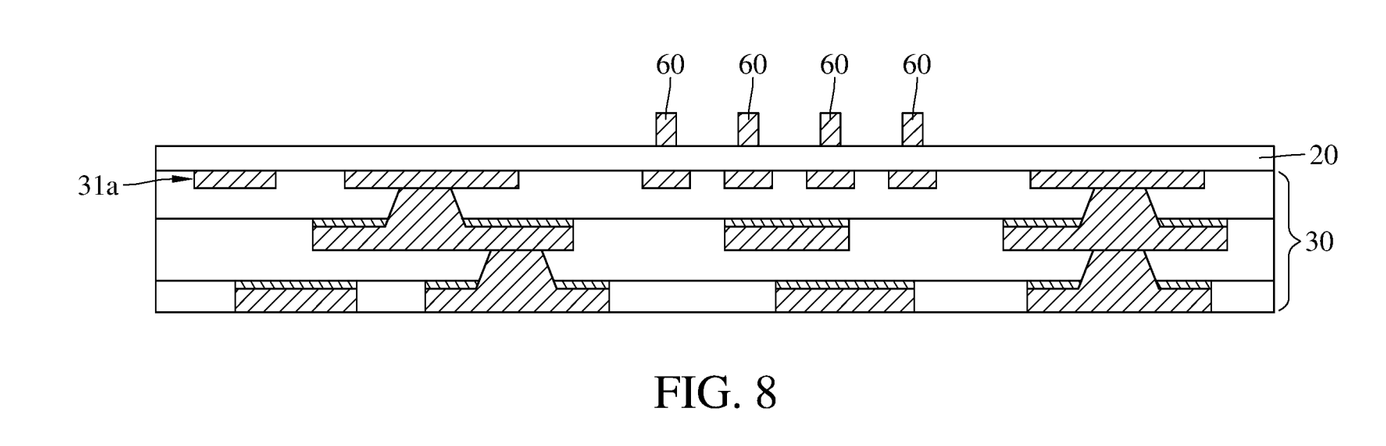

Then, please refer to FIGS. 7-8, at least one (or, one or more) conductive pillar 60 is disposed on the graphene layer 20. Note that the number and arrangement of the conductive pillars 60 on the graphene layer 20 are exemplary and are determined as required. In detail, firstly, as shown in FIG. 7, a patterned mask 50 is disposed on the graphene layer 20; specifically, after the removal of the metallic film 12 from the graphene layer 20, a patterned mask 50 is disposed on a side (or, surface) of the graphene layer 20 which is located furthest away from the build-up structure 30. The formation of the patterned mask 50 may involve the following steps: providing a photosensitive dielectric material on the selected surface of the graphene layer 20 and then removing part of the photosensitive dielectric material that is exposed to radiation so as to obtain a patterned mask 50.

The patterned mask 50 is able to expose a specific area of the graphene layer 20, For example, the patterned mask 50 is able to expose a portion of the graphene layer 20 which corresponds to one of the wiring layers of the build-up structure 30; specifically, as shown, the area of the graphene layer 20 not yet covered by the patterned mask 50 corresponds to a portion of the wiring layer 31a of the build-up structure 30. It is noted that the pattern of the patterned mask 50 may be determined according to actual requirements and is not intended to limit the disclosure.

Then, at least one conductive pillar 60 made of suitable metallic material (e.g., copper) is formed on the area of the graphene layer 20 not covered by the patterned mask 50 using process, such as electroplating or chemical plating. The area of the graphene layer 20 not covered by the patterned mask 50 corresponds to at least part of the wiring layer 31a, thus the conductive pillar 60 corresponds to at least part of the wiring layer 31a. After the formation of the conductive pillar 60, the patterned mask 50 is removed to reveal the part of the graphene layer 20 that was covered by the patterned mask 50. As shown in FIG. 8, the conductive pillars 60 remain on the graphene layer 20 and correspond to at least part of the wiring layer 31a.

Figure 9:
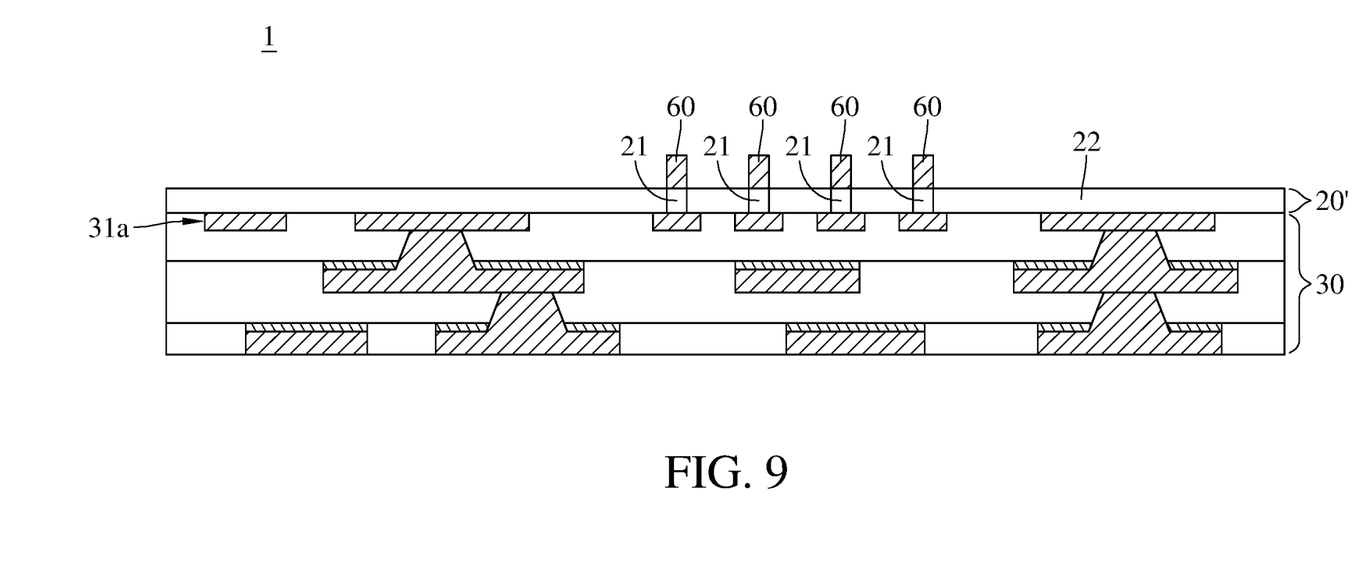

Then, please refer to FIG. 9, an oxidation treatment is performed on the graphene layer 20. Specifically, at least one conductive pillar 60 is disposed on the side (or, surface) of the graphene layer 20 which is located away from the build-up structure 30, in other words, at least one conductive pillar 60 is provided to partially cover the side (or, surface) of the graphene layer 20 which is located opposite to the build-up structure 30, thus the part of the graphene layer 20 not covered by the conductive pillar 60 will be oxidized and the part of the graphene layer 20 covered by the conductive pillar 60 will not be oxidized during the oxidation treatment performed on the graphene layer 20. As such, the graphene layer 20 is turned into a graphene layer 20'. As shown, a portion of the graphene layer 20' that includes graphene oxide is referred to be an oxidized area 22 while the rest portion of the graphene layer 20' that is not oxidized is referred to be a non-oxidized area 21. That is, the graphene layer 20' means a layer includes graphene and graphene oxide at the same time; in other words, the graphene layer 20' means a layer having a non-oxidized area 21 covered by the conductive pillar 60 and an oxidized area 22 not covered by the conductive pillar 60. The non-oxidized area 21 extends from the conductive pillar 60 to the wiring layer 31a of the build-up structure 30.

According to the property difference between the graphene and the graphene oxide as discussed above, when the graphene layer 20 becomes the graphene layer 20', the part of the graphene layer 20' including the graphene (i.e., the non-oxidized area 21) is still thermally conductive and electrically conductive, and the part of the graphene layer 20' including the graphene oxide (i.e., the oxidized area 22) is thermally conductive but becomes dielectric. As shown, the non-oxidized area 21 of the graphene layer 20' that corresponds to the conductive pillar 60 is thermally and electrically conductive, thus the non-oxidized area 21 is able to be electrically connected between the conductive pillar 60 and the wiring layer 31a of the build-up structure 30; the oxidized area 22 of the graphene layer 20' that does not correspond to the conductive pillar 60 is thermally conductive but not electrically conductive, thus the oxidized area 22 is an electrical insulator disposed on the build-up structure 30.

It is noted that the oxidation treatment performed on the graphene layer 20 may, but is not limited to, involve plasma oxidation which is performed with any suitable $O_2$ or $O_3$ flow rate, plasma power, and period of time. During the oxidation treatment, plasma is provided in a specific direction that is favorable for the electrically conductive non-oxidized area 21 to extend to the wiring layer 31a of the build-up structure 30 from the conductive pillar 60.

By following the aforementioned steps, a circuit board structure 1 which is a lamination of the build-up structure 30, the graphene layer 20', and the conductive pillar 60 is obtained.

Figure 10:
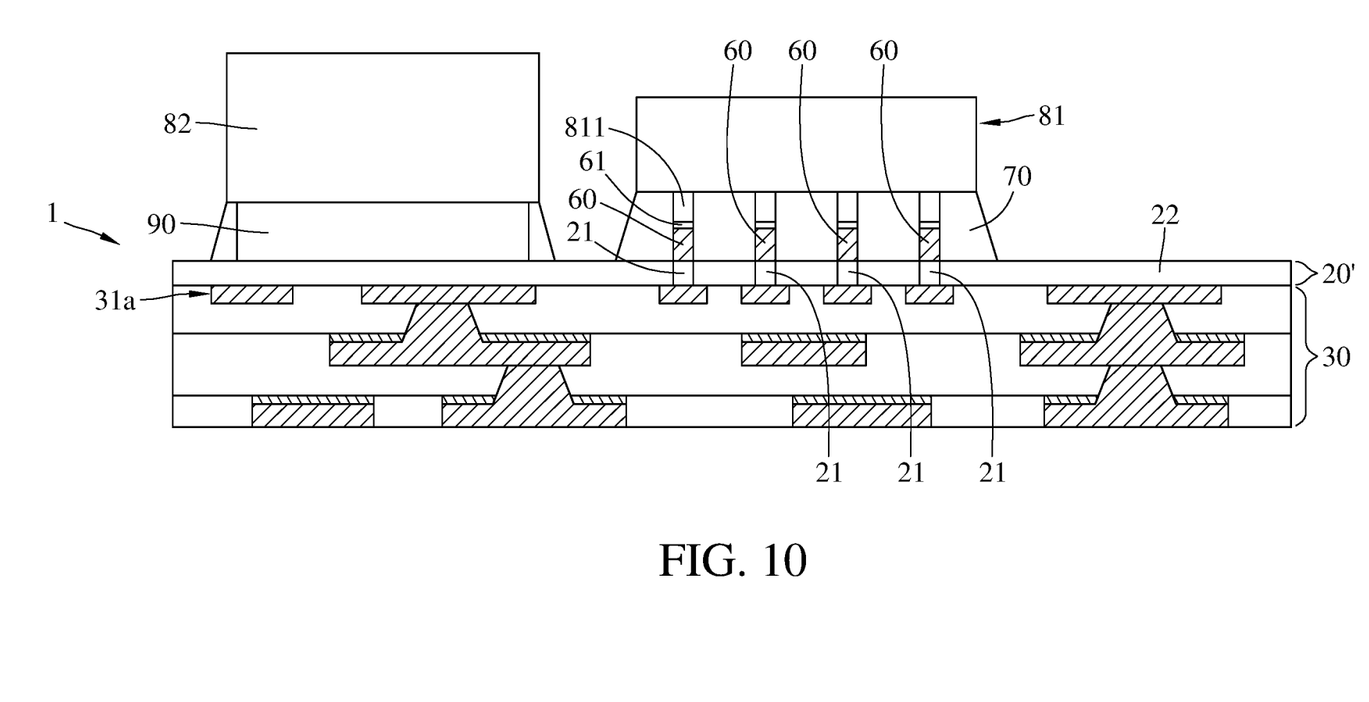

Then, please refer to FIG. 10, optionally, a heat source 81 may be disposed on the circuit board structure 1. Specifically, the heat source 81 is selectively disposed on the conductive pillars 60 of the circuit board structure 1. The heat source 81 is, for example, a chip or another electrical component that has pins 811 suitable to be electrically connected to the conductive pillars 60. As such, the heat source 81 is allowed to electrically connected to the wiring layer 31a of the build-up structure 30 via the conductive pillars 60 and the non-oxidized area 21 of the graphene layer 20'. As discussed, the graphene layer 20' is able to be employed as an electrically conductive layer for building electrical connection between the heat source 81 and the part of the build-up structure 30 needed to be electrically connected to the heat source 81.

Optionally, the pins 811 of the heat source 81 may be coupled to the conductive pillars 60 via solder balls 61, but the disclosure is not limited thereto; in some other embodiments, the pins 811 of the heat source 81 may be directly contact the conductive pillars 60 without solder balls therebetween.

In addition, after the installation of the heat source 81 onto the conductive pillars 60, a bonding structure 70 may be provided to cover the conductive pillars 60 and to be connected between the heat source 81 and the oxidized area 22. The bonding structure 70 may include epoxy resin or other suitable dielectric materials, but the disclosure is not limited thereto. In the embodiment that the bonding structure 70 is made of epoxy resin, the cured epoxy resin and the substance (i.e., graphene oxide) of the oxidized area 22 of the graphene layer 20' will be strongly bonded to each other and therefore is favorable for ensuring the fixation of the heat source 81 on the circuit board structure 1, thereby securing the electrical connection between the heat source 81 and the conductive pillars 60.

Optionally, a cooler 82 may be disposed on the circuit board structure 1. Specifically, a cooler 82 is selectively disposed on the oxidized area 22 of the graphene layer 20'. The cooler 82 is, for example, a passive or active component that facilitates heat dissipation. For example, the cooler 82 may be a heat sink, but the disclosure is not limited thereto. Optionally, a thermally-conductive structure 90 may be provided at a side of the cooler 82 and in thermal contact with the oxidized area 22 of the graphene layer 20'. The thermally-conductive structure 90 may, but is not limited to, include copper or other suitable thermally-conductive materials. As such, the cooler 82 is able to be in thermal contact with the oxidized area 22 of the graphene layer 20' via the thermally-conductive structure 90. Optionally, another bonding structure 70 may be provided to cover the thermally-conductive structure 90 and to be connected between the cooler 82 and the oxidized area 22. The material of the bonding structure 70 has a reliable and strong connection with the material of the oxidized area 22 of the graphene layer 20', thus the position of the cooler 82 on the circuit board structure 1 is secured.

In such an arrangement, the heat generated by the heat source 81 will be transferred to the cooler 82 through the conductive pillars 60, the graphene layer 20', and the thermally-conductive structure 90. As discussed, the graphene layer 20' can be served as a thermally-conductive layer between the conductive pillars 60 and the cooler 82 to efficiently transfer heat from the heat source 81 to the cooler 82 and thereby effectively cooling the heat source 81.

Note that the previous circuit board structure is exemplary and may be modified according to any actual requirements. For example, please refer to FIGS. 11-14, a part of the steps of a manufacturing method of a circuit board structure 1' according to another embodiment of the disclosure are given below. The main differences between the following embodiment and the previous embodiment are the arrangement of one of the wiring layers of the build-up structure and pattern that the patterned mask exposes the graphene layer, thus only the differences between the embodiments will be depicted and described below.

Figure 11:
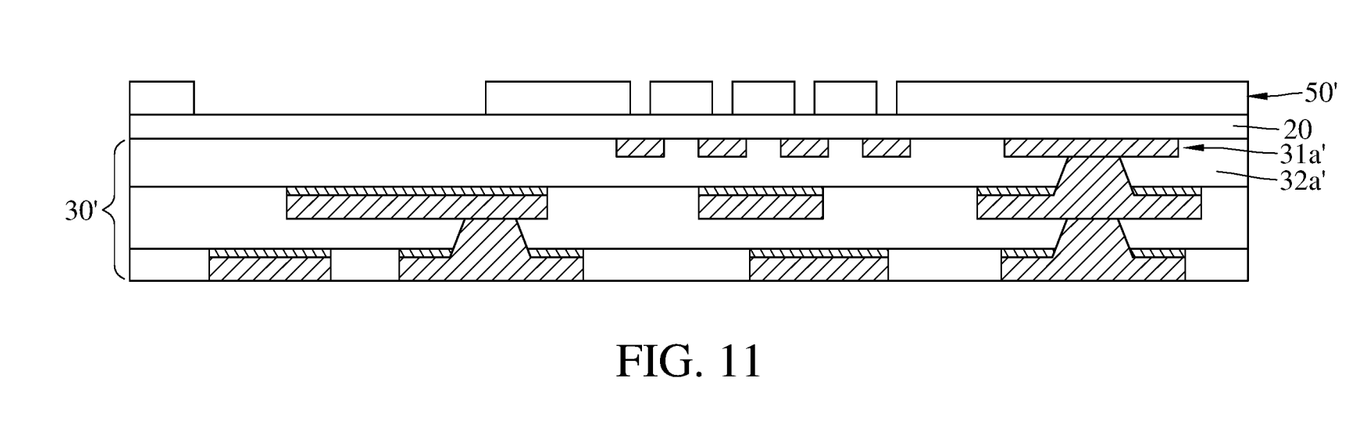
FIGS. 11-14 show the steps of a manufacturing method of a circuit board structure according to another embodiment of the disclosure.

Firstly, in FIG. 11, a patterned mask 50' is disposed on the graphene layer 20. Compared to the patterned mask 50 in the previous embodiment, the patterned mask 50' additionally exposes an area of the graphene layer 20 that will correspond to the cooler 82. For example, the patterned mask 50' partially exposes the area of the graphene layer 20 that is not in direct contact with a wiring layer 31a' of the build-up structure 30' (in other words, e.g., the patterned mask 50' partially exposes the area of the graphene layer 20 that is in direct contact with a dielectric layer 32a' of the build-up structure 30').

Figure 12:
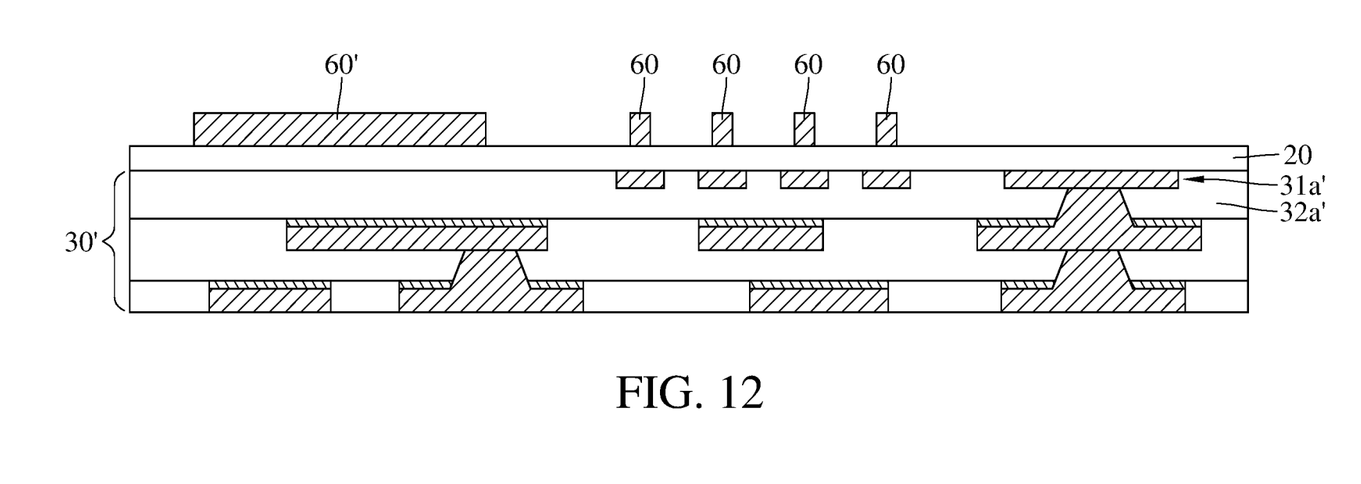

Then, one or more conductive pillars 60 and a conductive pillar 60' are formed on the areas of the graphene layer 20 not covered by the patterned mask 50', and then the patterned mask 50' will be removed, as shown in FIG. 12, the part of the graphene layer 20 that was covered by the patterned mask 50' is revealed and the conductive pillars 60 and 60' remain on the graphene layer 20. The conductive pillars 60 are located to correspond to the wiring layer 31a' of the build-up structure 30', and the conductive pillar 60' does not correspond to the wiring layer 31a' of the build-up structure 30'.

Figure 13:
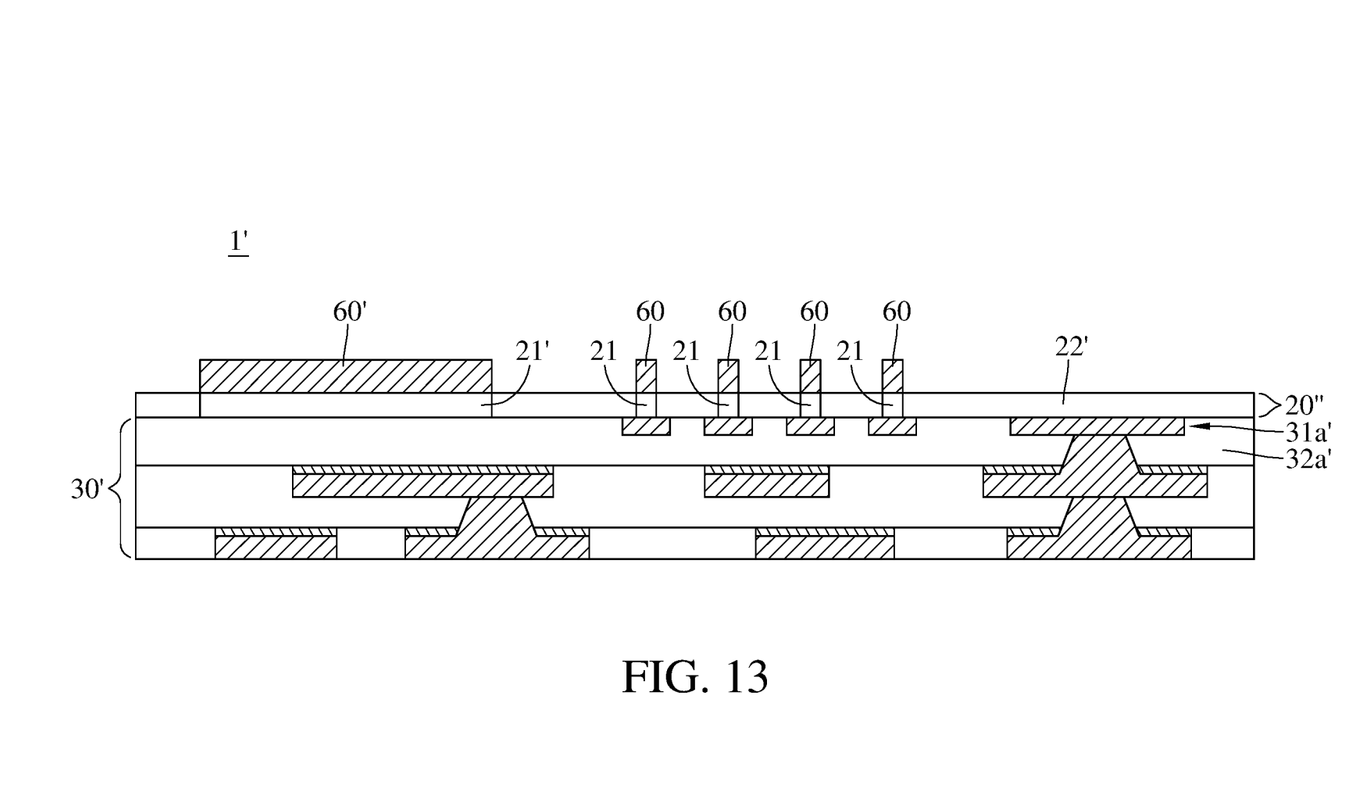

Then, please refer to FIG. 13, the oxidation treatment is performed on the graphene layer 20, such that the part of the graphene layer 20 that is not covered by the conductive pillars 60 and 60' is oxidized. The graphene layer 20 is turned into a graphene layer 20". As shown, a portion of the graphene layer 20" that is covered by the conductive pillars 60 and therefore is not oxidized is referred to be a non-oxidized area 21, the non-oxidized area 21 extends between the conductive pillars 60 and the wiring layer 31a of the build-up structure 30', another portion of the graphene layer 20" that is covered by the conductive pillar 60' and therefore is not oxidized is referred to be a non-oxidized area 21', the non-oxidized area 21' extends between the conductive pillar 60' and the dielectric layer 32a' of the build-up structure 30', the rest portion of the graphene layer 20" that is not covered by the conductive pillars 60 and 60' and therefore is oxidized is referred to be an oxidized area 22'. By following the aforementioned steps, a circuit board structure 1' which is a lamination of the build-up structure 30', the graphene layer 20", and the conductive pillars 60 and 60' is obtained.

Figure 14:
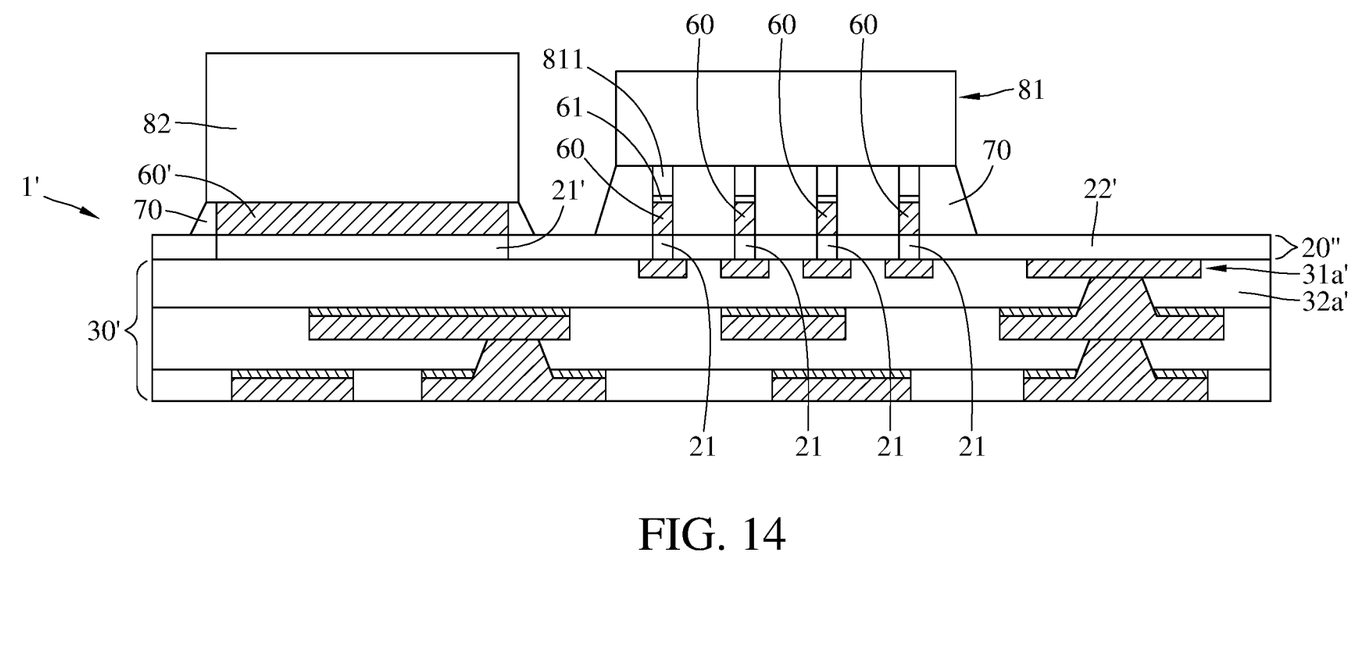

Then, please refer to FIG. 14, the heat source 81 is disposed on the conductive pillars 60 and firmly fixed in position using the bonding structure 70, and the cooler 82 may be in direct thermal contact with the conductive pillar 60' and firmly fixed in position using another bonding structure 70, that is, the conductive pillar 60' is located between the cooler 82 and the non-oxidized area 21'. As such, the heat generated by the heat source 81 can be transferred to the cooler 82 through the conductive pillars 60, the non-oxidized area 21, the oxidized area 22', and the non-oxidized area 21' of the graphene layer 20", and the conductive pillar 60'. Accordingly, the graphene layer 20" can be served as a thermally-conductive layer between the heat source 81 and the cooler 82 to efficiently transfer heat from the heat source 81 to the cooler 82 and thereby effectively cooling the heat source 81.

According to the circuit board structures and the manufacturing methods of the embodiments of the disclosure as discussed above, the graphene layer is provided on the carrier to be employed as a seed layer for the formation of the build-up structure, thus, during the removal of the metallic film of the carrier, due to its high resistance to the solvent used in removing the metallic film, the graphene layer is able to be served as an etching stop layer to effectively prevent the corrosives or solution that involved in removal of the metallic film from affecting or damaging the wiring layer of the build-up structure and thereby ensuring that the wiring layers remain the shape that meets the required signal transmission and signal integrity for the circuit board structure.

Also, considering the property difference between the graphene and the graphene oxide, the non-oxidized area of the graphene layer which is covered by the conductive pillar remains electrically conductive and therefore enables the required electrical connection between the conductive pillar and the internal wirings of the build-up structure, meanwhile, the portion of the graphene layer not covered by the conductive pillar is oxidized to be an oxidized area and therefore becomes dielectric, such that the oxidized area is able to protect the part of the build-up structure that does not correspond to the conductive pillar. Further, due to the high thermal conductivity of the graphene layer, the graphene layer can be employed as a thermally-conductive layer between a cooler and a heat source to efficiently transfer heat from the heat source to the cooler. Compared to the prior art that directly providing corrosives or solution to remove the metallic film will etch the wirings inside the build-up structure or compared to the prior art that adopts an etching stop layer needed to be removed eventually, the disclosure adopts a graphene layer as an etching stop layer not only can effectively prevent corrosives or solution that involved in removal of metallic film from etching wirings of build-up structure but also can served as a path for heat dissipation.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A circuit board structure, comprising:
    a build-up structure;
    a graphene layer disposed on the build-up structure; and
    at least one conductive pillar disposed on the graphene layer;
    wherein the graphene layer comprises an oxidized area not covered by the at least one conductive pillar and a non-oxidized area covered by the at least one conductive pillar, and the at least one conductive pillar is electrically connected to the build-up structure via the non-oxidized area.

2. The circuit board structure according to claim 1, further comprising a heat source disposed on the at least one conductive pillar.

3. The circuit board structure according to claim 2, further comprising a cooler disposed on the graphene layer and in thermal contact with the heat source via the graphene layer.

4. The circuit board structure according to claim 3, wherein the at least one conductive pillar comprises a plurality of conductive pillars, and one of the plurality of conductive pillars is located between the cooler and the non-oxidized area.

5. The circuit board structure according to claim 1, wherein the build-up structure comprises a plurality of wiring layers and a plurality of dielectric layers which are alternately stacked and a plurality of conductive vias which are electrically connected between the plurality of wiring layers, and the at least one conductive pillar is electrically connected to one of the plurality of wiring layers which is located closest to the graphene layer via the non-oxidized area.

6. A manufacturing method of a circuit board structure, comprising:
    providing a carrier;
    forming a graphene layer on the carrier;
    forming a build-up structure on the graphene layer;
    removing the carrier from the graphene layer;
    disposing at least one conductive pillar on the graphene layer; and performing an oxidation treatment on the graphene layer so as to form an oxidized area not covered by the at least one conductive pillar and a non-oxidized area covered by the at least one conductive pillar on the graphene layer.

7. The manufacturing method according to claim 6, wherein disposing the at least one conductive pillar on the graphene layer comprises:
disposing a patterned mask on the graphene layer; and
forming the at least one conductive pillar on area of the graphene layer which is not covered by the patterned mask.

8. The manufacturing method according to claim 7, wherein the area of the graphene layer which is not covered by the patterned mask corresponds to one of a plurality of wiring layers of the build-up structure which is located closest to the graphene layer.

9. The manufacturing method according to claim 7, wherein the at least one conductive pillar is electrically connected to one of a plurality of wiring layers of the build-up structure which is located closest to the graphene layer via the non-oxidized area.

10. The manufacturing method according to claim 6, wherein forming the build-up structure on the graphene layer comprises:
alternately stacking a plurality of wiring layers and a plurality of dielectric layers on the graphene layer and forming a plurality of conductive vias which are electrically connected between the plurality of wiring layers.

11. The manufacturing method according to claim 6, wherein forming the graphene layer on the carrier comprises:
forming the graphene layer on a metallic film of the carrier.

12. The manufacturing method according to claim 11, wherein removing the carrier from the graphene layer comprises:
removing a substrate of the carrier from the metallic film; and
removing the metallic film from the graphene layer.

13. The manufacturing method according to claim 6, further comprising:
disposing a heat source on the at least one conductive pillar; and
providing a bonding structure to cover the at least one conductive pillar and to be connected between the heat source and the oxidized area.

14. The manufacturing method according to claim 13, further comprising:
disposing a cooler on the graphene layer so that the heat source is in thermal contact with the cooler via the graphene layer.

* * * * *